(12) United States Patent
Frechette et al.

(10) Patent No.: US 6,184,723 B1
(45) Date of Patent: Feb. 6, 2001

(54) DIRECT VOLTAGE TO PTAT CURRENT CONVERTER FOR MULTIPLE GAIN CONTROL SLOPE FOR WIDE DYNAMIC RANGE VGA

(75) Inventors: Michel Frechette; Maher A. Abuzaid, both of Plano, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/261,590

(22) Filed: Mar. 3, 1999

(51) Int. Cl.$^7$ ........................................................ H03K 5/22
(52) U.S. Cl. .......................... 327/68; 327/538; 327/540; 323/312
(58) Field of Search ..................... 330/252, 253, 330/256, 266; 327/560, 562, 52, 65, 68, 77, 83, 90, 96, 538, 540, 541; 323/312, 313, 315

(56) References Cited

U.S. PATENT DOCUMENTS

| | | | |
|---|---|---|---|
| 3,617,916 | * 11/1971 | Smith | 327/407 |
| 4,586,155 | * 4/1986 | Gilbert | 327/357 |
| 4,965,528 | * 10/1990 | Okanobu | 330/252 |
| 5,345,185 | * 9/1994 | Gilbert | 327/350 |
| 5,463,332 | * 10/1995 | Yee et al. | 326/126 |
| 5,867,062 | * 2/1999 | Kuduo | 330/124 R |

* cited by examiner

Primary Examiner—Timothy P. Callahan
Assistant Examiner—An T. Luu
(74) Attorney, Agent, or Firm—Ronald O. Neerings; Wade James Brady, III; Frederick J. Telecky, Jr.

(57) ABSTRACT

A system and method for converting an analog control voltage to a PTAT current. A plurality of differential transistor pairs is provided, each differential pair including a reference transistor and a non-reference transistor, each transistor having a current path and a control electrode. A first output is coupled to a first end of the current path of each of said non-reference transistors and output means is coupled to a first end of the current path of each of the reference transistors. A plurality of current sources is provided, one current source for each differential pair, each current source having a current path coupled to an opposing end of the current path of a different one of the transistor pairs and a control electrode. A PTAT current generator is coupled to the control electrode of each of the current sources. Each differential pair is provided with a pair of electron emitting electrodes coupled together, the current source being coupled to the electron emitting electrodes. The current sources can provide the same or different current outputs. A pair of such circuits can be provided, each with a different slope, with a control determining which circuit output will be provided to the system.

16 Claims, 2 Drawing Sheets

US 6,184,723 B1

DIRECT VOLTAGE TO PTAT CURRENT CONVERTER FOR MULTIPLE GAIN CONTROL SLOPE FOR WIDE DYNAMIC RANGE VGA

FIELD OF THE INVENTION

This invention relates to a linear direct voltage to proportional to absolute temperature (PTAT) current converter for use in conjunction with a variable-gain amplifier (VGA) to convert a variable control input voltage to a current proportional to absolute temperature in a linear manner.

BACKGROUND AND BRIEF DESCRIPTION OF THE PRIOR ART

Generally, control of VGAs involves a linear voltage control range, generally about two volts, and provides only a single control slope. In addition, the prior art control voltage is normally distorted in order to provide a linear transfer function in dB at the VGA output. Other approaches required to transform the control voltage into a PTAT current which will serve as the tail current of the amplifier. This PTAT current conversion requires a two step operation, the first operation being to convert the control voltage to a current which is not proportional to absolute temperature and then to translate that current to a proportionality to absolute temperature (a PTAT current) by multiplying that current by a current which is proportional to absolute temperature and dividing the product by a current which is not proportional to absolute temperature. These operations are circuitry intensive. Furthermore, this type of control also normally has a limited dynamic range characteristic and does not guarantee a constant gain control slope.

SUMMARY OF THE INVENTION

In accordance with the present invention, the above described disadvantages of the prior art are minimized and there is provided a current converter which directly and in a single step generates a PTAT current from an input voltage that is linear relative to a wide range of input voltages, this PTAT current also being controllable with appropriate component design of the circuitry to change the slope of the PTAT current being produced after a predetermined input voltage has been reached and exceeded. The converter in accordance with the present invention provides a direct voltage to PTAT current conversion which allows for easy control of the gain slopes as well as maximum linear dynamic range by using the current not as the tail current of the amplifier, but rather to generate an exponential PTAT current by the use of a simple current mirror, the current which will be mirrored directly into the VGA core.

Briefly, the above is accomplished by providing a plurality of differential transistor amplifier pairs, one of the transistors of each pair being designated a reference transistor and the other transistor being designated a non-reference transistor. Current is concurrently fed to the conduction path of each transistor pair by a current source transistor, there being a separate such current source for each transistor pair. Each current source is designed to provide an amount of current when conductive based upon the design thereof. In general, each of the current sources will provide the same amount of current when energized. However, it is contemplated that the geometry of certain ones of the current sources can be fabricated to provide a different current output relative to other current sources to provide a change in the slope of the output PTAT current. Each current source is driven by a standard PTAT current generator to provide a PTAT current output.

The control electrodes of the non-reference transistors are each connected to the input which is the control voltage discussed hereinabove. The control electrodes of the reference transistors are each coupled to a different reference input voltage. The reference voltages define a range of voltages within which the system is to operate with each of the different reference input voltages being set at a different portion of this range whereby the totality of the reference transistors cover the entire range of voltages. The opposite end of the current path of each of the non-reference transistors is coupled to the same output line whereby the outputs of the non-reference transistors are added together and supplied to an output. The opposite end of the current path of each of the reference transistors is coupled to the same output line which is a different output line with the current applied thereto not generally being used.

In operation, one or the other of each differential transistor pair is conductive. As the input voltage to the system increases but is below the reference voltage at the gate of the non-reference transistor set to the lowest reference voltage, all of the reference transistors will conduct. When the input voltage increases to that of the lowest reference voltage and beyond, the non-reference transistor coupled to the reference transistor set to the lowest reference voltage will conduct and increase conduction with the paired reference transistor concurrently ceasing conduction. As the input voltage increases to that of the next lowest reference voltage and beyond, the non-reference transistor coupled to the reference transistor set to the next lowest reference voltage will conduct and increase conduction with the paired reference transistor concurrently ceasing conduction. The is operation continues from transistor pair to transistor pair as the input voltage increases with the summed output of the non-reference transistors providing a linear output with slope determined by the geometry of the current source transistors. Assuming that these geometries are the same, then the slope of the output current is linear and constant. The slope can be changed by altering the geometry of certain ones of the current source transistors whereby such current source transistors with altered geometry provide a different current to the associated transistor pair relative to the current provided by other current source transistors of the system. This output current will then be summed with a fixed PTAT current, as shown in FIG. 5, through resistor RDAC, hence controlling the $V_{BE}$s of both transistors $Q_1$ and $Q_2$. The output of transistor $Q_2$ is an exponential PTAT current which is a function of the input control voltage.

DESCRIPTION OF THE PREFERRED EMBODIMENT

Figure 1:
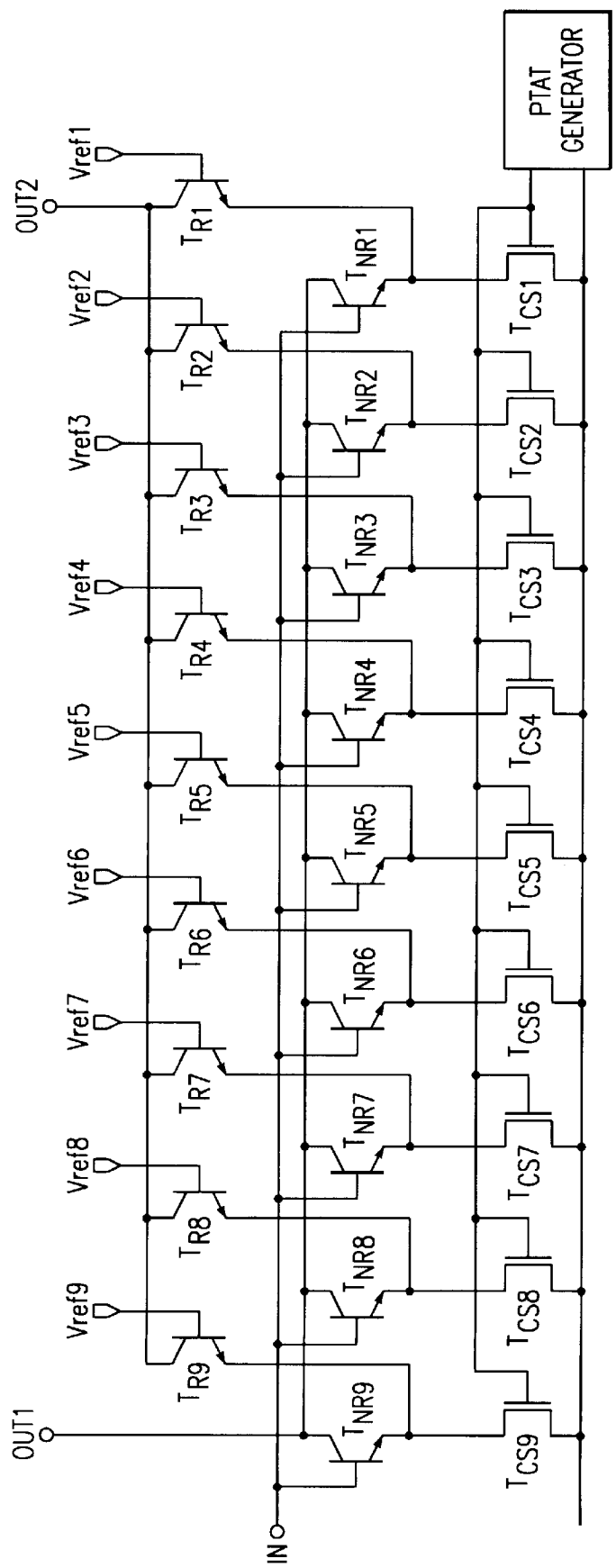
FIG. 1 is a circuit diagram of a direct voltage to PTAT current converter for multiple gain control slope for wide dynamic range VGA.

Referring first to FIG. 1, there is shown an input voltage ($V_{vgo}$) to IPTAT circuit in accordance with the present invention. There are shown a plurality of differential transistor pairs $T_{R1}$–$T_{NR1}$, $T_{R2}$–$T_{NR2}$, ..., $T_{R9}$–$T_{NR9}$, each of the differential transistor pairs being composed of an NPN transistor pair with interconnected emitters. While NPN transistors are being demonstrated, it should be understood that PNP transistors can be used with appropriate changes in the circuitry which are well known to those skilled in the art. A separate current source transistor $T_{CS1}$, ..., $T_{CS9}$ is coupled via a source/drain terminal thereof to each of the interconnected emitters of the differential transistor pairs with the other source/drain terminal of each of the current sources being coupled to reference voltage or ground. The gate terminals of the current sources are coupled to a PTAT current generator of standard construction, such as, for example, the translinear quad. The operation of the circuit of the PTAT current generator will not be explained since, per se, it forms no part of the present invention and is used to provide a PTAT current to the current source transistors.

The input voltage to be converted is received at input terminal IN and is applied to the gate terminals of all of the non-reference transistors forming one half of each differential pair, this half being that half which is not coupled to a source of gate reference voltage or non-reference voltage half. A separate different reference voltage, to be explained in more detail hereinbelow, is applied to the gate terminals of the other or reference transistor half of each of the differential pairs. The system output current is taken from the collector terminals of each transistor of the non-reference transistor half of each differential pair along to same line and these outputs are summed together and provided at the output terminal OUT1.

Figure 4:
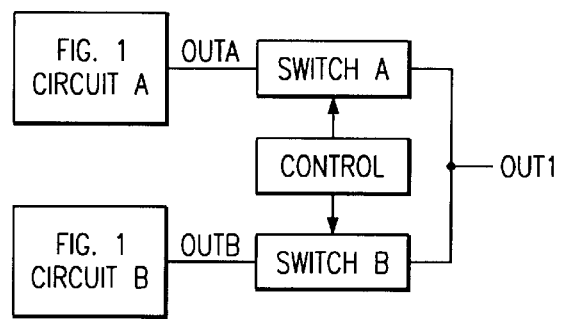
FIG. 4 is a schematic diagram showing operation of a system using two circuits of the type shown in FIG. 1, each providing a different slope.

The reference voltage applied to the gate terminals of the reference transistor half of each differential pair will encompass a different portion of the voltage range to which the converter will be applied. For a voltage range of less than $V_{BE}+V_{DS}$, where $V_{BE}$ is approximately 0.8 volts and $V_{DS}$ is approximately 0.4 volts, then the control voltage must be altered to satisfy the resulting headroom of 1.2 (0.8+0.4) volts. This is achieved by adding a percentage of a bandgap voltage to the control voltage during this condition as illustrated in FIG. 4. The resulting control voltage now becomes control voltage plus [0.816×bandgap], whereas the control voltage then becomes 1.20 to 2.1 volts. For example, if the voltage range of interest is from 0.35 volts to 1.0 volts, $V_{ref1}$ to the gate of transistor $T_{R1}$ can be set to a voltage of 1.25 volts, $V_{ref2}$ to the gate of transistor $T_{R2}$ can be set to a voltage of 1.35 volts, $V_{ref3}$ to the gate of transistor $T_{R3}$ can be set to a voltage of 1.45 volts, $V_{ref4}$ to the gate of transistor $T_{R4}$ can be set to a voltage of 1.55 volts, $V_{ref5}$ to the gate of transistor $T_{R5}$ can be set to a voltage of 1.65 volts, $V_{ref6}$ to the gate of transistor $T_{R6}$ can be set to a voltage of 1.75 volts, $V_{ref7}$ to the gate of transistor $T_{R7}$ can be set to a voltage of 1.85 volts, $V_{ref8}$ to the gate of transistor $T_{R8}$ can be set to a voltage of 1.95 volts and $V_{ref9}$ to the gate of transistor $T_{R9}$ can be set to a voltage of 2.05. It follows that, with a voltage from 1.2 volts up to but less than 1.3 volts, the differential pair including $V_{ref1}$ will conduct, with a voltage from 1.3 up to but less than 1.4 volts the differential pair including $V_{ref2}$ will conduct while almost all of the tail current from $V_{ref1}$ will be directed to the terminal OUT1, and so forth in the same manner for higher voltages. There can be conduction in one of the transistor pair at both ends for a period between the low and high end of the range for that pair.

Figure 2:
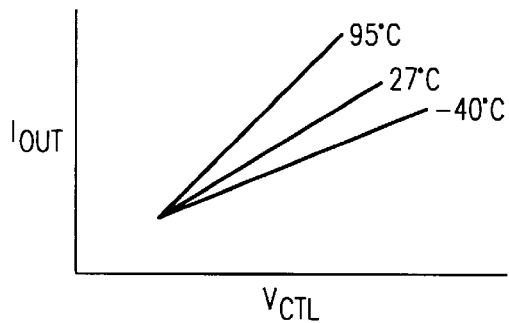
FIG. 2 is a graph showing the output of the circuit of FIG. 1 when all of the current sources are the same.
Figure 3:
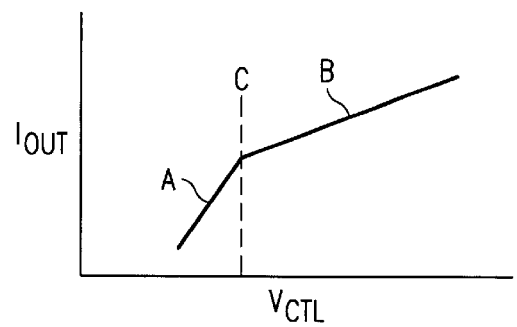
FIG. 3 is a graph showing the output of the circuit of FIG. 1 when the current sources differ and of FIG. 4 where one of two circuits provides an output at any given time.

The slope of the current output at OUT 1 is determined by the amount of current supplied by the current source transistors $T_{CS1}$, ..., $T_{CS9}$. The current supplied by the current source transistors is determined by the geometries of the transistors themselves, this geometry being provided during transistor fabrication as is well known and requires no further explanation. Accordingly, the slope of the current output can be changed, for example, when a particular voltage to the gates of the non-reference transistors has been reached by altering the geometries during device fabrication of all transistors of the current sources to the differential pairs in the circuit which are responsive to input voltages at and above that particular voltage. With reference to FIG. 2, the output at OUT 1 is shown where all of the current source transistors provide the same current. The slope in FIG. 2 can be altered by altering the geometry of the current source transistors but maintaining such geometry the same from current source transistor to current source transistor. With reference to FIG. 3, the portion of the curve labeled "A" is provided when the current source transistors have a first identical geometry and the portion of the curve labeled "B" is provided when the current source transistor at coupled to differential transistor pairs having a reference voltage of "C" or higher have a second identical geometry different from the first identical geometry.

Figure 5:
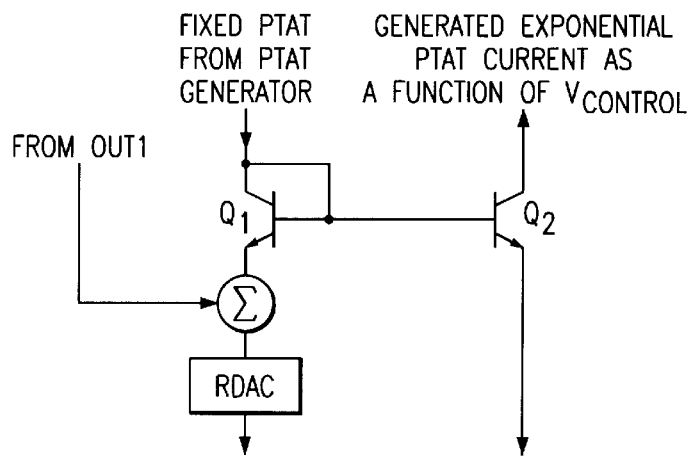
FIG. 5 is a schematic diagram showing the generation of the exponential PTAT.

It is possible to alternate between an output as shown in FIG. 2 and an output as shown in FIG. 3 by providing a pair of circuits of the type shown in FIG. 1, each circuit being provided with a set of identical current source transistors with the current source transistor of the two circuits having a different slope. Each circuit output line OUT1 is fed to distinctive exponential generators such as in FIG. 5. With specific reference to FIG. 5, OUT1 from FIG. 4 is fed to a summer along with the output from NPN transistor Q1. The summer is also connected to reference voltage via resistor RDAC. Fixed PTAT from the PTAT generator is fed to both the base and collector of transistor Q1, the base of transistor Q1 also being coupled to the base of a second NPN transistor Q2. Transistor Q2 is coupled to reference voltage via its collector and to the generated exponential PTAT current as a function of $V_{CONTROL}$ at its emitter. The continuity between the slopes is controlled by the logic circuit shown in FIG. 4. Both circuits are provided with the same input IN, however, for control voltage less than 1.2 volts, the control voltage must be modified prior to application to the circuit. The output from each circuit to output line OUT1 can be controlled externally to provide, as desired, the slope of one or the other of the circuits. This concept can be extended to more than two circuits, each having a different slope.

A circuit to accomplish the above is shown in FIG. 4 wherein two circuits identical to the circuit of FIG. 1 are shown as CIRCUIT A and CIRCUIT B. However, the geometry of the current sources in each of CIRCUIT A and CIRCUIT B are different to provide different slopes as shown in FIG. 3. The input voltage is fed to each circuit concurrently along the IN line and an output is provided by each circuit at OUTA for circuit A and at OUTB for circuit B. However, CIRCUIT A receives its modified input, as IN(1), explained hereinabove. However, CIRCUIT B can be controlled directly by $V_{CONTROL}$ if CIRCUIT B in put control voltage starts at a value greater than about 1.2 volts as explained hereinabove.

The reason for cascading the differential pairs is that each differential pair has limited range, therefore requiring the cascading to increase the range. The resulting output current is proportional to absolute temperature.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A system for converting a control voltage to a PTAT current which comprises:
   (a) a plurality of differential transistor pairs, each differential transistor pair including a reference transistor and a non-reference transistor, each said transistor having a current path and a control electrode for controlling current in said current path, the control electrodes of said reference transistors each being coupled to a different reference voltage source;
   (b) a first output path coupled to a first end of the current path of each of said non-reference transistors;
   (c) a second output path coupled to a first end of the current path of each of said reference transistors;
   (d) a plurality of current sources, one current source for each differential pair, each said current source having a current path coupled to an opposing end of the current path of a different one of said transistor pairs and each current sources also having a control electrode; and
   (e) a PTAT current generator coupled to the control electrode of each of said current sources to control said current sources.

2. The system of claim 1 wherein each said differential pair includes a pair of electron emitting electrodes coupled together said current source being coupled to said electron emitting electrodes.

3. The system of claim 1 wherein each of said current sources provides substantially the same current output.

4. The system of claim 2 wherein each of said current sources provides substantially the same current output.

5. The system of claim 1 wherein predetermined ones of said current sources provide current outputs different from other of said current sources.

6. The system of claim 2 wherein predetermined ones of said current sources provide current outputs different from other of said current sources.

7. A system for converting a control voltage to a PTAT current which comprises:
   (a) a first circuit which comprises:
      (i) a plurality of differential transistor pairs, each differential pair including a reference transistor and a non-reference transistor, each transistor having a current path and a control electrode;
      (ii) a first output coupled to a first end of the current path of each of said non-reference transistors;
      (iii) output means coupled to a first end of the current path of each of said reference transistors;
      (iv) a plurality of current sources, one current source for each differential pair, each said current source having a current path coupled to an opposing end of the current path of a different one of said transistor pairs and a control electrode; and
      (v) a PTAT current generator coupled to the control electrode of each of said current sources;
   (b) a second circuit which comprises;
      (i) a plurality of differential transistor pairs, each differential pair including a reference transistor and a non-reference transistor, each transistor having a current path and a control electrode;
      (ii) a first output coupled to a first end of the current path of each of said non-reference transistors;
      (iii) output means coupled to a first end of the current path of each of said reference transistors;
      (iv) a plurality of current sources, one current source for each differential pair, each said current source having a current path coupled to an opposing end of the current path of a different one of said transistor pairs and a control electrode; and
      (v) a PTAT current generator coupled to the control electrode of each of said current sources; and
   (c) means to enable the output means of one of said first and second circuits and disable the output means of the other of said first and second circuits.

8. The system of claim 7 wherein each said differential pair includes a pair of electron emitting electrodes coupled together said current source being coupled to said electron emitting electrodes.

9. A method for converting a control voltage to a PTAT current which comprises the steps of:
   (a) providing a plurality of differential transistor pairs, each differential transistor pair including a reference transistor and a non-reference transistor, each said transistor having a current path and a control electrode for controlling current in said current path, the control electrodes of said reference transistors each being coupled to a different reference voltage source;
   (b) providing a first output path coupled to a first end of the current path of each of said non-reference transistors;
   (c) providing a second output path coupled to a first end of the current path of each of said reference transistors;
   (d) providing a plurality of current sources, one current source for each differential pair, each said current source having a current path coupled to an opposing end of the current path of a different one of said transistor pairs and each current source also having a control electrode; and
   (e) coupling a PTAT current generator to the control electrode of each of said current sources to control said current sources.

10. The method of claim 9 wherein each said differential pair is provided with a pair of electron emitting electrodes coupled together said current source being coupled to said electron emitting electrodes.

11. The method of claim 9 wherein each of said current sources provides substantially the same current output.

12. The method of claim 10 wherein each of said current sources provides substantially the same current output.

13. The method of claim 9 wherein predetermined ones of said current sources provide current outputs different from other of said current sources.

14. The method of claim 10 wherein predetermined ones of said current sources provide current outputs different from other of said current sources.

15. A method for converting a control voltage to a PTAT current which comprises:
   (a) providing a first circuit which comprises:
      (i) a plurality of differential transistor pairs, each differential pair including a reference transistor and a non-reference transistor, each transistor having a current path and a control electrode;
      (ii) a first output coupled to a first end of the current path of each of said non-reference transistors;
      (iii) output means coupled to a first end of the current path of each of said reference transistors;
      (iv) a plurality of current sources, one current source for each differential pair, each said current source having a current path coupled to an opposing end of the current path of a different one of said transistor pairs and a control electrode; and (v) a PTAT current generator coupled to the control electrode of each of said current sources;

(b) providing a second circuit which comprises;

(i) a plurality of differential transistor pairs, each differential pair including a reference transistor and a non-reference transistor, each transistor having a current path and a control electrode;

(ii) a first output coupled to a first end of the current path of each of said non-reference transistors;

(iii) output means coupled to a first end of the current path of each of said reference transistors;

(iv) a plurality of current sources, one current source for each differential pair, each said current source having a current path coupled to an opposing end of the current path of a different one of said transistor pairs and a control electrode; and (v) a PTAT current generator coupled to the control electrode of each of said current sources; and (c) enabling the output means of one of said first and second circuits and disabling the output means of the other of said first and second circuits.

16. The method of claim 15 wherein each said differential pair includes a pair of electron emitting electrodes coupled together said current source being coupled to said electron emitting electrodes.

* * * * *